US012672592B2

(12) United States Patent
Youm et al.

(10) Patent No.: US 12,672,592 B2
(45) Date of Patent: Jun. 30, 2026

(54) INTEGRATED CIRCUIT PACKAGING WITH INSULATION STRUCTURE TO CONTROL GAP HEIGHT AND DIE TILT

(71) Applicant: Allegro MicroSystems, LLC, Manchester, NH (US)

(72) Inventors: David Youm, Malden, MA (US); Weidong Wang, Westford, MA (US); Natasha Healey, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 364 days.

(21) Appl. No.: 18/583,987

(22) Filed: Feb. 22, 2024

(65) Prior Publication Data

US 2025/0273546 A1 Aug. 28, 2025

(51) Int. Cl.
| | |
|---|---|
| *H10W 90/00* | (2026.01) |
| *H10W 70/40* | (2026.01) |
| *H10W 72/20* | (2026.01) |
| *H10W 72/90* | (2026.01) |
| *H10W 74/00* | (2026.01) |

(52) U.S. Cl.
CPC ........ *H10W 90/811* (2026.01); *H10W 70/415* (2026.01); *H10W 70/435* (2026.01); *H10W 90/00* (2026.01); *H10W 72/221* (2026.01); *H10W 72/242* (2026.01); *H10W 72/921* (2026.01); *H10W 72/923* (2026.01); *H10W 72/9415* (2026.01); *H10W 74/00* (2026.01); *H10W 90/724* (2026.01)

(58) Field of Classification Search
CPC .................................................. H10W 90/811
See application file for complete search history.

(56) References Cited

U.S. PATENT DOCUMENTS

| | | | |
|---|---|---|---|
| 5,041,780 | A | 8/1991 | Rippel |
| 6,819,095 | B1 | 11/2004 | Dubhashi et al. |
| 6,995,315 | B2 | 2/2006 | Sharma et al. |

(Continued)

FOREIGN PATENT DOCUMENTS

| | | |
|---|---|---|
| EP | 0042165 | 12/1981 |
| EP | 2295993 | 3/2011 |
| WO | WO 2016/164265 | 10/2016 |

OTHER PUBLICATIONS

Office Action dated Sep. 10, 2024 for U.S. Appl. No. 17/648,310, 58 pages.

(Continued)

*Primary Examiner* — Ajay Arora
(74) *Attorney, Agent, or Firm* — Daly, Crowley, Mofford & Durkee, LLP

(57) ABSTRACT

A current sensor integrated circuit (IC) package includes an insulation structure disposed between a semiconductor die and a lead frame to control gap height and prevent the die from tilting and dropping the magnetic field coupling between the die the primary conductor. An insulation structure is disposed between the die and the lead frame such that the die remains level and magnetic coupling remains intact. An insulation structure may control the gap height between the lead frame and the die evenly during transfer molding, by supporting the die across its length and/or width. Epoxy dots are also or instead used to control the gap height and eliminate die tilt.

34 Claims, 14 Drawing Sheets

(56) References Cited

U.S. PATENT DOCUMENTS

| | | | |
|---|---|---|---|
| 7,075,287 | B1 | 7/2006 | Mangtani et al. |
| 7,166,807 | B2 | 1/2007 | Gagnon et al. |
| 7,476,816 | B2 | 1/2009 | Doogue et al. |
| 7,598,601 | B2 | 10/2009 | Taylor et al. |
| 7,709,754 | B2 | 5/2010 | Doogue et al. |
| 8,080,994 | B2 | 12/2011 | Taylor et al. |
| 8,717,016 | B2 | 5/2014 | Ausserlechner et al. |
| 8,907,437 | B2 | 12/2014 | Milano et al. |
| 8,963,536 | B2 | 2/2015 | Ausserlechner |
| 9,190,606 | B2 | 11/2015 | Liu et al. |
| 9,865,807 | B2 | 1/2018 | Liu et al. |
| 10,345,343 | B2 | 7/2019 | Milano et al. |
| 10,352,969 | B2 | 7/2019 | Milano et al. |
| 10,753,963 | B2 | 8/2020 | Milano et al. |
| 10,914,765 | B1 | 2/2021 | Bussing et al. |
| 11,262,385 | B2 | 3/2022 | Milano et al. |
| 11,366,141 | B1 | 6/2022 | Daubert et al. |
| 11,644,485 | B2 | 5/2023 | Liu et al. |
| 11,800,813 | B2 | 10/2023 | Latham et al. |
| 12,210,040 | B2 | 1/2025 | Milano et al. |
| 2004/0135220 | A1 | 7/2004 | Goto |
| 2006/0087314 | A1 | 4/2006 | Zhu et al. |
| 2006/0219436 | A1 | 10/2006 | Taylor et al. |
| 2007/0170533 | A1 | 7/2007 | Doogue et al. |
| 2007/0279053 | A1 | 12/2007 | Taylor et al. |
| 2008/0297138 | A1 | 12/2008 | Taylor et al. |
| 2009/0243074 | A1 | 10/2009 | Ramiah et al. |
| 2009/0295368 | A1 | 12/2009 | Doogue et al. |
| 2010/0156394 | A1 | 6/2010 | Ausserlechner et al. |
| 2010/0188078 | A1 | 7/2010 | Foletto et al. |
| 2010/0207258 | A1 | 8/2010 | Eun et al. |
| 2011/0234215 | A1* | 9/2011 | Ausserlechner ....... G01R 15/20 |
| | | | 324/244 |
| 2012/0049304 | A1 | 3/2012 | Motz et al. |
| 2013/0020660 | A1 | 1/2013 | Milano et al. |
| 2013/0126212 | A1 | 5/2013 | Martens et al. |
| 2013/0187644 | A1* | 7/2013 | Tay ..................... G01R 33/072 |
| | | | 324/251 |
| 2014/0264843 | A1 | 9/2014 | Lin et al. |
| 2022/0137097 | A1 | 5/2022 | Milano et al. |
| 2025/0067778 | A1 | 2/2025 | Milano et al. |

OTHER PUBLICATIONS

Urabe Hiroyuki et al; Current Detector; Date Published Jun. 9, 2005, Mitsubishi Electric Corp., JP 200514775A; (Year: 2005) pp. 11 pgs.

Response to U.S. Non-Final Office Action dated Sep. 10, 2024 for U.S. Appl. No. 17/648,310; Response filed Sep. 24, 2024; 8 Pages.

European Notice of Allowance dated Dec. 17, 2024 for EP Application No. 17203672.5; 60 Pages.

Extended European Search Report with references dated Apr. 13, 2018 for EP Application No. EP 17203672.5; 225 pages.

Response to Search Opinion filed on Nov. 30, 2018 for European Application No. 17203672.5; 21 Pages.

European Exam Report dated Aug. 2, 2021 for European Application No. 17203672.5; 8 pages.

Response to European Exam Report dated Aug. 2, 2021, filed on May 6, 2022 for European Application No. 17203672.5; 12 pages.

European Exam Report dated Dec. 14, 2023 for European Application No. 17203672.5; 4 pages.

Response to European Exam Report dated Dec. 14, 2023, filed on Dec. 28, 2023 for European Application No. 17203672.5; 92 pages.

Restriction Requirement dated Nov. 14, 2018 for U.S. Appl. No. 15/363,285; 19 Pages.

Preliminary Amendment and Response to Restriction Requirement dated Nov. 14, 2018 for U.S. Appl. No. 15/363,285, filed Nov. 26, 2018; 9 Pages.

Office Action dated Dec. 31, 2018 for U.S. Appl. No. 15/363,285; 22 Pages.

Response to Office Action dated Dec. 31, 2018 for U.S. Appl. No. 15/363,285, filed Mar. 8, 2019; 13 Pages.

Notice of Allowance dated Apr. 2, 2019 for U.S. Appl. No. 15/363,285; 13 Pages.

Restriction Requirement dated Sep. 25, 2020 for U.S. Appl. No. 16/421,982; 12 Pages.

Amendment and Response to Restriction Requirement dated Sep. 25, 2020 filed Oct. 5, 2020 for U.S. Appl. No. 16/421,982; 8 Pages.

Office Action dated Oct. 22, 2020 for U.S. Appl. No. 16/421,982; 20 Pages.

Response to Office Action dated Oct. 22, 2020 filed Dec. 3, 2020 for U.S. Appl. No. 16/421,982; 10 Pages.

Final Office Action dated Feb. 23, 2021 for U.S. Appl. No. 16/421,982; 16 Pages.

Response to Final Office Action dated Feb. 23, 2021 filed Apr. 5, 2021 for U.S. Appl. No. 16/421,982; 13 Pages.

Office Action dated Jul. 8, 2021 for U.S. Appl. No. 16/421,982; 28 Pages.

Response to Office Action dated Jul. 8, 2021 filed Jul. 20, 2021 for U.S. Appl. No. 16/421,982; 13 Pages Final Office Action dated Oct. 22, 2021 for U.S. Appl. No. 16/421,982; 34 Pages.

Response to Final Office Action dated Oct. 22, 2021 filed Nov. 17, 2021 for U.S. Appl. No. 16/421,982; 14 Pages.

Notice of Allowance dated Jan. 11, 2022 for U.S. Appl. No. 16/421,982; 18 Pages.

Restriction Requirement dated Feb. 21, 2024 for U.S. Appl. No. 17/648,310, 9 pages.

Response to Restriction Requirement dated Feb. 21, 2024, filed Feb. 27, 2024 for U.S. Appl. No. 17/648,310, 8 pages.

Office Action dated Mar. 28, 2024 for U.S. Appl. No. 17/648,310, 34 pages.

Response to Office Action dated Mar. 28, 2024, filed Apr. 18, 2024 for U.S. Appl. No. 17/648,310, 12 pages.

Final Office Action dated May 17, 2024 for U.S. Appl. No. 17/648,310, 36 pages.

RCE and Response to Office Action dated May 17, 2024, filed Jun. 14, 2024 for U.S. Appl. No. 17/648,310, 13 pages.

\* cited by examiner

INTEGRATED CIRCUIT PACKAGING WITH INSULATION STRUCTURE TO CONTROL GAP HEIGHT AND DIE TILT

BACKGROUND

During the manufacture of some current sensor integrated circuit (IC) packages, a semiconductor die carrying the sensing elements is disposed over a lead frame that includes the primary conductor and a number of signal leads. During assembly, placement of the die over an insulation material creates a gap between the die, the primary conductor and the signal leads. A gap height differential may occur when, for example, the gap between the semiconductor die and the primary conductor differs from the gap between the semiconductor die and the signal leads. The differing gap heights may be a result of inconsistent or collapsed solder bumps, isolation tape thickness, and/or a combination of both.

For example, changing the thickness of an isolation tape on the primary conductor may require increasing the size of solder bumps on the signal leads. Doing so, however, may cause the solder bumps to collapse and the die to tilt towards the signal leads. The tilt can compromise the magnetic field coupling to the lead frame. In some cases, the die may undesirably touch the lead frame due to a substantial tilt.

Die tilt may cause partial discharge failures on voltage isolation testing as well as sensitivity drift. FIG. 1 depicts a partial view of a prior art IC package 100 with an undesirable die tilt. The IC package 100 includes a die 102 partially disposed over an insulation material 108, a primary conductor 104 and signal leads 106. As shown, the placement of the die 102 over a gap 110 between the primary conductor 104 and the signal leads 106 causes the die 102 to be disposed at an angle with respect to the primary conductor 104 and the signal leads 106. This tilt compromises the coupling of the die 102 with the primary conductor 104 and the signal leads 106 and may cause the IC package to fail.

SUMMARY

Aspects of the present disclosure relate to current sensor integrated circuits (IC) including an insulation structure disposed between a semiconductor die and a lead frame to control gap height and/or prevent the die from tilting and degrading the magnetic field coupling between the die the primary conductor. An insulation structure may be disposed between the die and the lead frame such that the die remains level and magnetic coupling remains intact. According to one aspect, an insulation structure may control the gap height between the lead frame and the die evenly during transfer molding by supporting the die across its length and/or width. According to other aspects, epoxy dots may also or instead be used to control the gap height and reduce die tilt.

According to one aspect, a current sensor IC package may include a lead frame having a primary conductor and signal leads. The lead frame may have a lead frame surface. A semiconductor die may have a die surface adjacent to the lead frame surface and may include a magnetic field sensing element supported by the semiconductor die. The magnetic field sensing element may be configured to sense a magnetic field associated with a current through the primary conductor and generate an output signal indicative of the current. An insulation structure may have first and second portions. The first portion may be located between a first location on the die surface and the primary conductor, and the second portion may be located between a second location on the die surface and a first one of the signal leads. The insulation structure may be configured to prevent a tilt of the semiconductor die.

The current sensor IC package can include one or more of the following features alone or in combination. The first and second portions of the insulation structure may comprise a single body of material. The single body may comprise a T-shape. The insulation structure may comprise a polymer film. The insulation structure may further comprise an adhesive layer. The polymer film and the adhesive layer may be provided as a tape. The tape may extend beyond a periphery of the semiconductor die. The tape may extend beyond the primary conductor adjacent to the signal leads by at least 0.4 mm. The insulation structure may comprise one or more epoxy dots. The first portion may comprise a polymer film and the second portion may comprise an epoxy dot. The epoxy dot may be substantially rectangular, substantially oval, or polygonal. The epoxy dot may be screen printed onto the first one of the signal leads. The epoxy dot may be dimensioned to be within dimensions of the first one of the signal leads. The insulation structure may be adapted to support the semiconductor die across one or both of a width or a length of the semiconductor die.

According to another aspect, a method of manufacturing a current sensor IC package may include providing a lead frame comprising a primary conductor and signal leads. The lead frame may have a lead frame surface. A semiconductor die having a die surface adjacent to the lead frame surface may be positioned such that the semiconductor die supports a magnetic field sensing element. The magnetic field sensing element may be configured to sense a magnetic field associated with a current through the primary conductor and to generate an output signal indicative of the current. A first portion of an insulation structure may be positioned between a first location on the die surface and the primary conductor. A second portion of the insulation structure may be positioned between a second location on the die surface and a first one of the signal leads. The insulation structure may be configured to prevent a tilt of the semiconductor die.

The method can include one or more of the following features alone or in combination. The first and second portions of the insulation structure may comprise a single body of material. The single body may comprise a T-shape. The insulation structure may comprise a polymer film. The insulation structure may further comprise an adhesive layer. The polymer film and the adhesive layer may be provided as a tape. The tape may extend beyond a periphery of the semiconductor die. The tape may extend beyond the primary conductor adjacent to the signal leads by at least 0.4 mm. The insulation structure may comprise one or more epoxy dots. The first portion may comprise a polymer film and the second portion may comprise an epoxy dot. The epoxy dot may be substantially rectangular, substantially oval, or polygonal. Positioning the epoxy dot may comprise screen printing the epoxy dot onto the first one of the signal leads. The epoxy dot may be dimensioned to be within dimensions of the first one of the signal leads. The insulation structure may be adapted to support the semiconductor die across one or both of a width or a length of the semiconductor die.

According to another aspect, a current sensor IC package may include a lead frame having a primary conductor and signal leads. The lead frame may have a lead frame surface. A semiconductor die may have a die surface adjacent to the lead frame surface and may include a magnetic field sensing element supported by the semiconductor die. The magnetic field sensing element may be configured to sense a magnetic field associated with a current through the primary conductor and generate an output signal indicative of the current. An insulation structure may have first and second portions. The first portion may be located between a first location on the die surface and the primary conductor, and the second portion may be located between a second location on the die surface and a first one of the signal leads. The insulation structure may be configured to form a first gap height between the first location on the die surface and the primary conductor and a second gap height between the second location on the die surface and the first one of the signal leads.

The current sensor IC package can include the first gap height and the second gap height being substantially equal.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, aspects of the present disclosure are illustrated by way of example and not limitation in the figures, in which.

DETAILED DESCRIPTION

Figure 1:
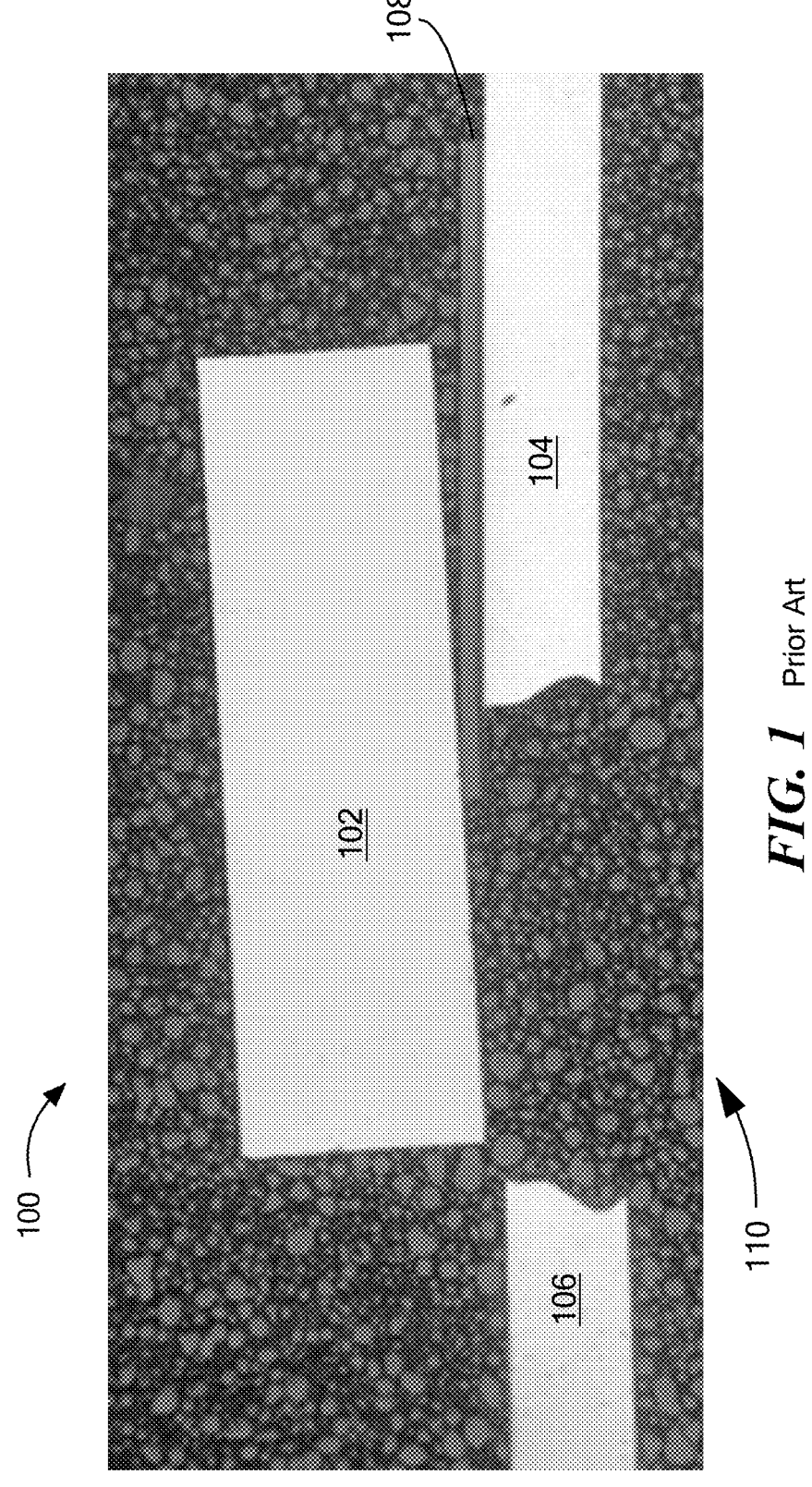
FIG. 1 is a partial side-view of a prior art integrated circuit (IC) package including a semiconductor die disposed at a tilt.
Figure 2A:
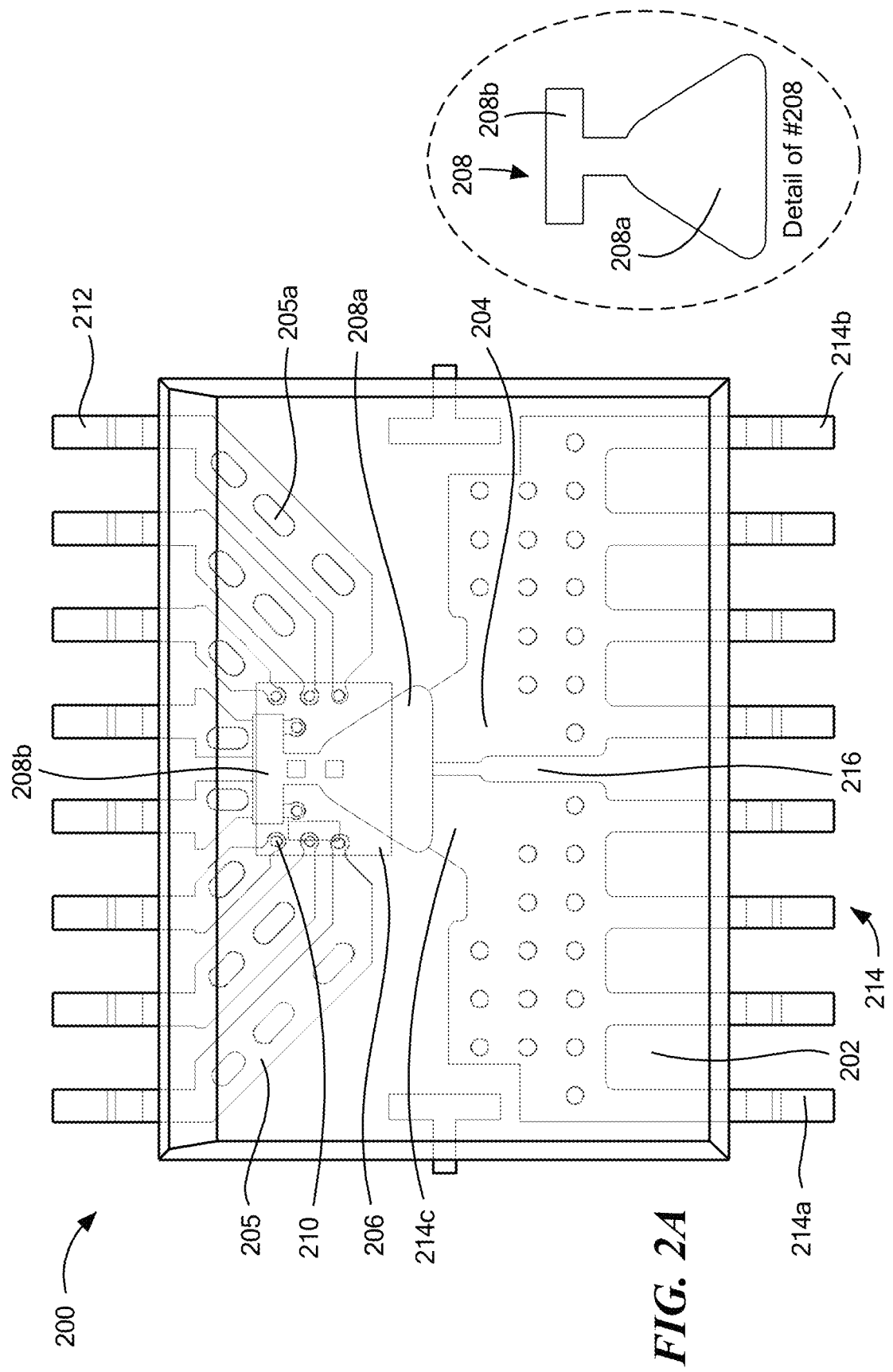
FIG. 2A is a partially transparent top view of an IC package including an insulation structure according to aspects of the disclosure.
Figure 2B:
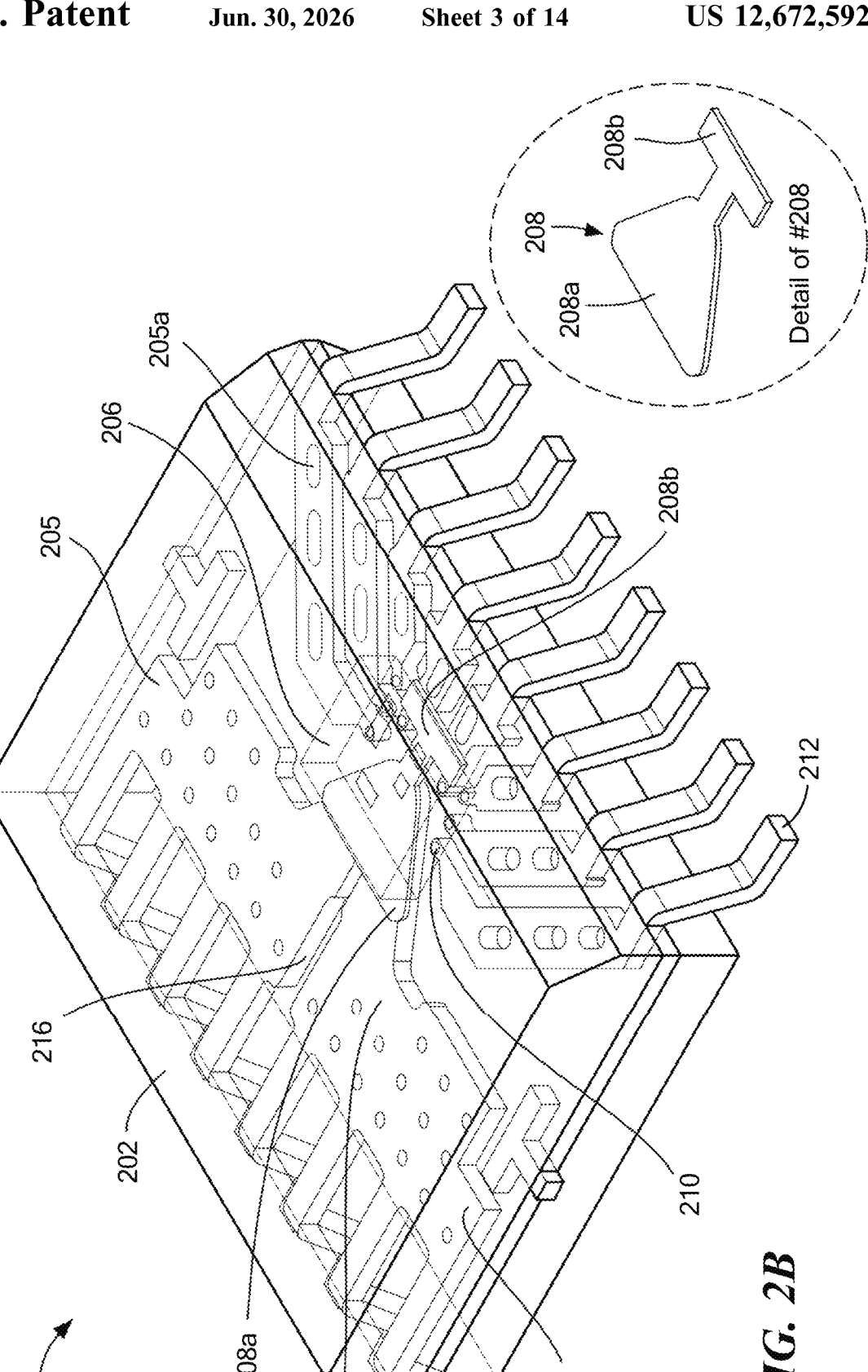
FIG. 2B is a partially transparent isometric view of the IC package in FIG. 2A according to aspects of the disclosure.
Figure 2C:
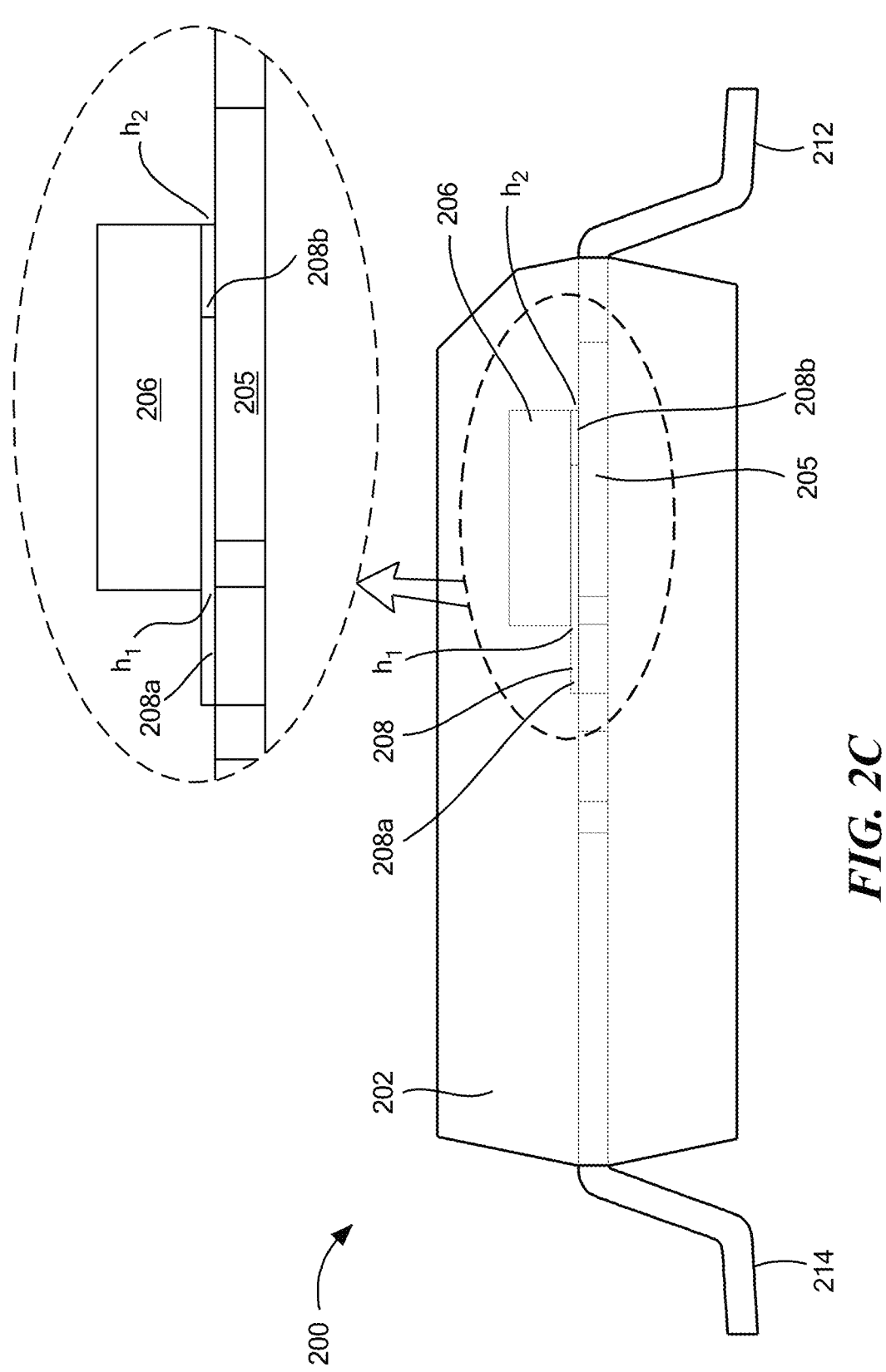
FIG. 2C is a partially transparent side view of the IC package in FIG. 2A according to aspects of the disclosure.

Referring to the various views of FIGS. 2A-2C, a current sensor integrated circuit (IC) package 200 includes a lead frame 205 with a primary conductor 204 and a plurality of signal leads, collectively labeled 212. It will be appreciated by those of ordinary skill in the art that although the lead frame 205 is shown to have eight signal leads, other numbers, dimensions, spacing, and configurations of leads are possible.

A semiconductor die 206 may include a first magnetic field sensing element (not shown) for sensing a magnetic field associated with a current through the primary conductor 204 to generate a first output signal indicative of the current for coupling to a signal lead 212. With this arrangement, the semiconductor die 206 is arranged in a so-called flip-chip configuration in which the sensing element is supported by a die surface proximal to the lead frame 205.

According to one aspect, the magnetic field sensing element can be a single element or can include more than one element, such as a dual Hall element or a quad Hall element or one or more magnetoresistance elements as are sometimes arranged in a bridge configuration and as may be used to implement differential magnetic field sensing.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

The primary conductor 204 may have various shapes and dimensions to accommodate a range of current levels sought to be detected by the current sensor IC package 200 and the desired package footprint. In general, primary conductor 204 may include an input portion 214a, an output portion 214b, and a thinned current path region 214c between the input and output portions. In use, a current flow may be established through the primary conductor 204 between the input and output portions 214a, 214b.

The input and output portions 214a, 214b of the primary conductor 204 may have respective terminal ends in the form of leads, collectively labeled 214, configured for electrical connection on a printed circuit board (PCB) or other substrate on which the current sensor IC package 200 may be mounted. The leads 214 of the primary conductor 204 and signal leads 212 can take various forms, such as the illustrated leads that are bent to facilitate surface mount solder connection to a PCB or other substrate. The current sensor IC package 200 may be considered an SOIC (Small Outline Integrated Circuit) package. In other embodiments, package types include QFN (Quad-Flat No-Leads), DFN (Dual-Flat No-Leads), and the like.

The thinned current path region 214c of the primary conductor 204 can have various shapes and other characteristics. Here, the thinned current path region 214c is curved in a "horseshoe" shape to form a notch 216. Placement of the magnetic field sensing element relative to the curved, thinned current path region 214c and notch 216 may concentrate the magnetic field generated by current through the primary conductor 214 on the sensing elements. It will be appreciated that other shapes, dimensions, notches, and sensing element placement can be implemented to achieve concentration of the magnetic field.

According to one aspect, the magnetic field sensing element can include one or more elements that are substantially vertically aligned with a first side of the notch 216 and one or more elements that are substantially vertically aligned with a second side of the notch 216. As current flows through the primary conductor 204, having a magnetic field sensing element positioned to the sides of the conductor (rather than directly over or under the conductor) results in magnetic field with components perpendicular to the semiconductor die 206 such that the sensing elements may be planar Hall effect elements. In other aspects, the magnetic field sensing element or elements may be positioned directly over the primary conductor 204 to sense magnetic field components parallel to the surface of semiconductor die 206, in which case sensing elements such as a vertical Hall element, a GMR, TMR, or AMR element may be used.

The lead frame 205 may comprise any suitable conductive material, such as copper or copper alloy or Aluminum, and its features can be formed by various methods such as stamping or etching.

According to one aspect, the flip-chip configured semiconductor die 206 may be electrically and mechanically coupled to the lead frame 205 by various mechanisms, including bumps 210, which may be or include solder bumps or copper pillars, as non-limiting examples, with which semiconductor die 206 is connected to leads 212. The solder may be a Sn—Pb solder or a lead less solder, such as an Indium solder. One or more bumps 210 may be so-called "dummy" bumps, in that they provide only mechanical attachment and/or stability rather than both mechanical and electrical coupling. In the case of a dummy bump, the bond pad to which the dummy bump is connected is not electrically connected to the circuitry on the die 206. Such electrical isolation may be achieved with materials including, but not limited to an oxide, a nitride, or a polymer isolation layer or combinations thereof.

In applications in which the primary conductor 204 can be at a relatively high voltage, safety specifications require that a certain electrical isolation be maintained between the primary conductor 204 and other parts of the circuitry (e.g., signal leads 212 coupled to an external system to which a sensor output signal is communicated). According to one aspect of the disclosure, electrical isolation between the primary conductor 204 and the flip-chip semiconductor die 206 may be achieved with various mechanisms, such as with an insulation structure 208 disposed, at least, between the primary conductor 204 and the proximal surface of the semiconductor die 206.

According to one aspect, the insulation structure 208 may, in addition to providing electrical isolation between the primary conductor 204 and the semiconductor die 206, may provide gap height control between the die 206 and the lead frame 205 and prevent die tilt during the manufacturing process. The insulation structure 208 may include or one or more portions adapted to support the semiconductor die 206 across its length and/or width such that the semiconductor die 206 is disposed flatly, or evenly, over the lead frame 205 reducing any die tilt. As used herein, zero die tilt refers to a gap height, for example between about 1.8 mm and 2.8 mm, between the lead frame 205 and the semiconductor die 206 that is substantially the same at the primary conductor 204 as it is at the signal leads 212.

According to one aspect, a first portion 208a of the isolation structure may be disposed between the semiconductor die 206 and the primary conductor and a second portion 208b may be located between the semiconductor die 206 and at least one of the signal leads 212. The first portion 208a may form or create a first gap height h1 between the semiconductor die 206 and the primary conductor 204. The second portion 208b may form or create a second gap height h2 between the semiconductor die 206 and at least one of the signal leads 212. According to one aspect, the insulation structure 208 may be substantially T-shaped, with a base portion, such as the first portion 208a, disposed between the semiconductor die 206 and the current path region 214c of the primary conductor 204 and a top portion, such as the second portion 208b, disposed between the semiconductor die 206 and at least one of the signal leads 212. Accordingly, the insulation structure 208 may support the semiconductor die 206 across the length and/or width of the semiconductor die 206, such that the first gap height h1 and the second gap height h2 are substantially equal. In this way, the insulation structure 208 provides an even surface to which the semiconductor die 206 may be coupled or bonded with reduced or zero tilt.

According to one aspect, the base portion, such as first portion 208a, of the insulation structure 208 may extend beyond the periphery of the semiconductor die 206 and/or the primary conductor 204 so as to achieve a required clearance specification. For example, in certain aspects, the insulation structure 208 may extend beyond the die 206 and/or primary conductor 204 by a distance of at least 0.4 mm. The overall size and shape of the insulation structure 208, as further described herein, may vary with the size/shape of the die 206 and primary conductor 204.

The insulation structure 208 may include an organic polymer such as polyimide, or an oxide insulating material like silicon dioxide in the form of a glass sheet, silicone or ceramic. For example, the insulation structure 208 may be a polymer film, as may be provided in the form of a polyimide or Kapton® tape, as non-limiting examples. The insulation structure 208 may include an adhesive layer, in which case the polymer film and the adhesive layer may be provided as a tape with which the insulating layers are attached to the lead frame 205 and such an adhesive layer can itself provide insulation.

An attachment material can be provided to mechanically attach the semiconductor die 206 to the insulation structure 208. According to some aspects, the semiconductor die 206 may be attached to the insulation structure 208 by an adhesive layer of the insulation structure 208 itself (i.e., an adhesive layer of an insulating tape). According to other aspects, semiconductor die 206 may be attached to the insulation structure 208 by a non-conductive adhesive, such as wafer backside coating or dispensed epoxy or a combination of both wafer backside coating and dispensed non-conductive epoxy, as non-limiting examples.

The current sensor IC package 200 may include insulating material in the form of a mold material 202 configured to encapsulate the semiconductor die 206 and portions of the lead frame 205. The mold material 202 is shown to illustrate elements encapsulated within the IC package 200. Various materials can be used to form the mold material 202, including, but not limited to a plastic material.

Portions of the lead frame 205 may include features configured to enhance adhesion of the mold material 202 to the lead frame 205, thereby serving as a "locking mechanism" to secure parts of the IC package 200 together. Here, holes 205a through the primary conductor 204 and the signal leads 212 can provide such a locking mechanism.

According to one aspect of the disclosure, fabrication of the current sensor IC package 200 can be accomplished by first attaching the flip-chip semiconductor die 206 to the surface of the lead frame 205. This step can include attaching the insulation structure 208 to the primary conductor 204 and at least one of signal leads 212, then attaching the bumps 210, such as soldering bumps or copper pillars, to plated areas of the surface of the lead frame 205 for electrical connection to the signal leads 212.

The entire structure, excluding terminal ends of the signal leads 212 and primary leads 214, can be overmolded with mold material 202 in a mold process step, following which terminal ends of the primary conductor leads 214 and the signal leads 212 can be bent, as shown. The mold material 202 may be formed by a transfer mold process, which may include one or more mold process steps.

Figure 3A:
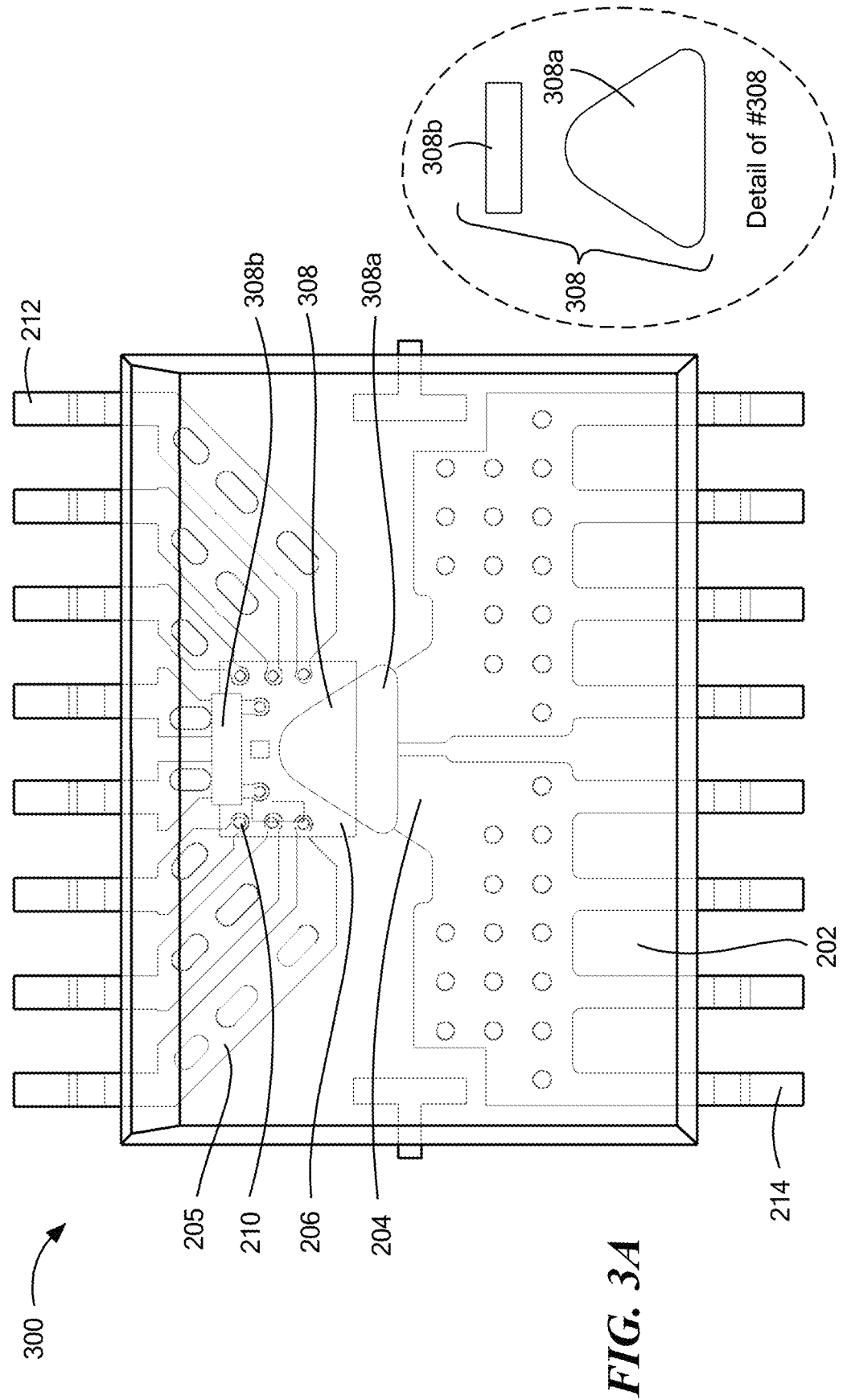
FIG. 3A is a top plan view of an IC package including a multi-portion insulation structure according to aspects of the disclosure.
Figure 3B:
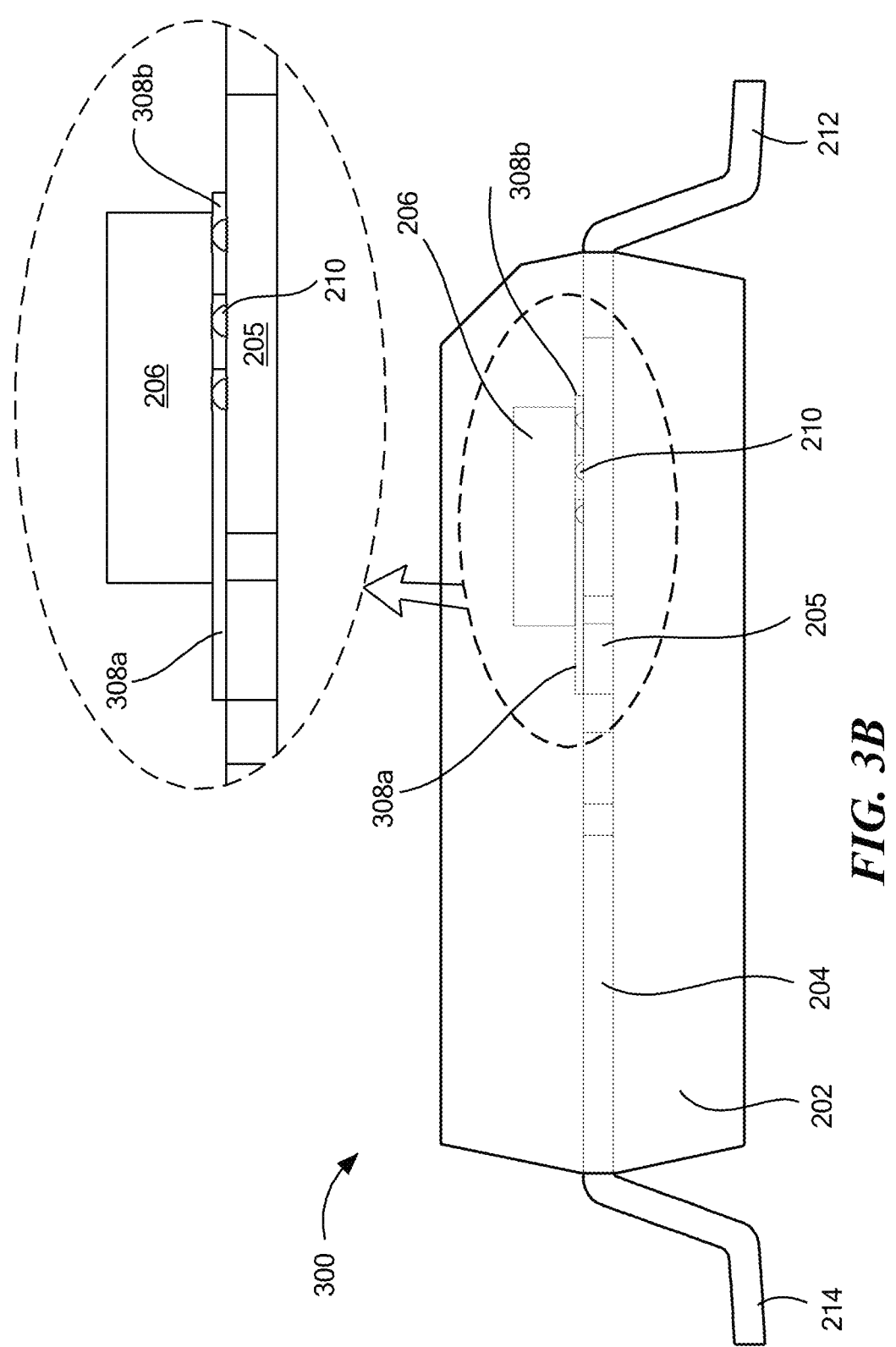
FIG. 3B is a side view of the IC package of FIG. 3A according to aspects of the disclosure.
Figure 3C:
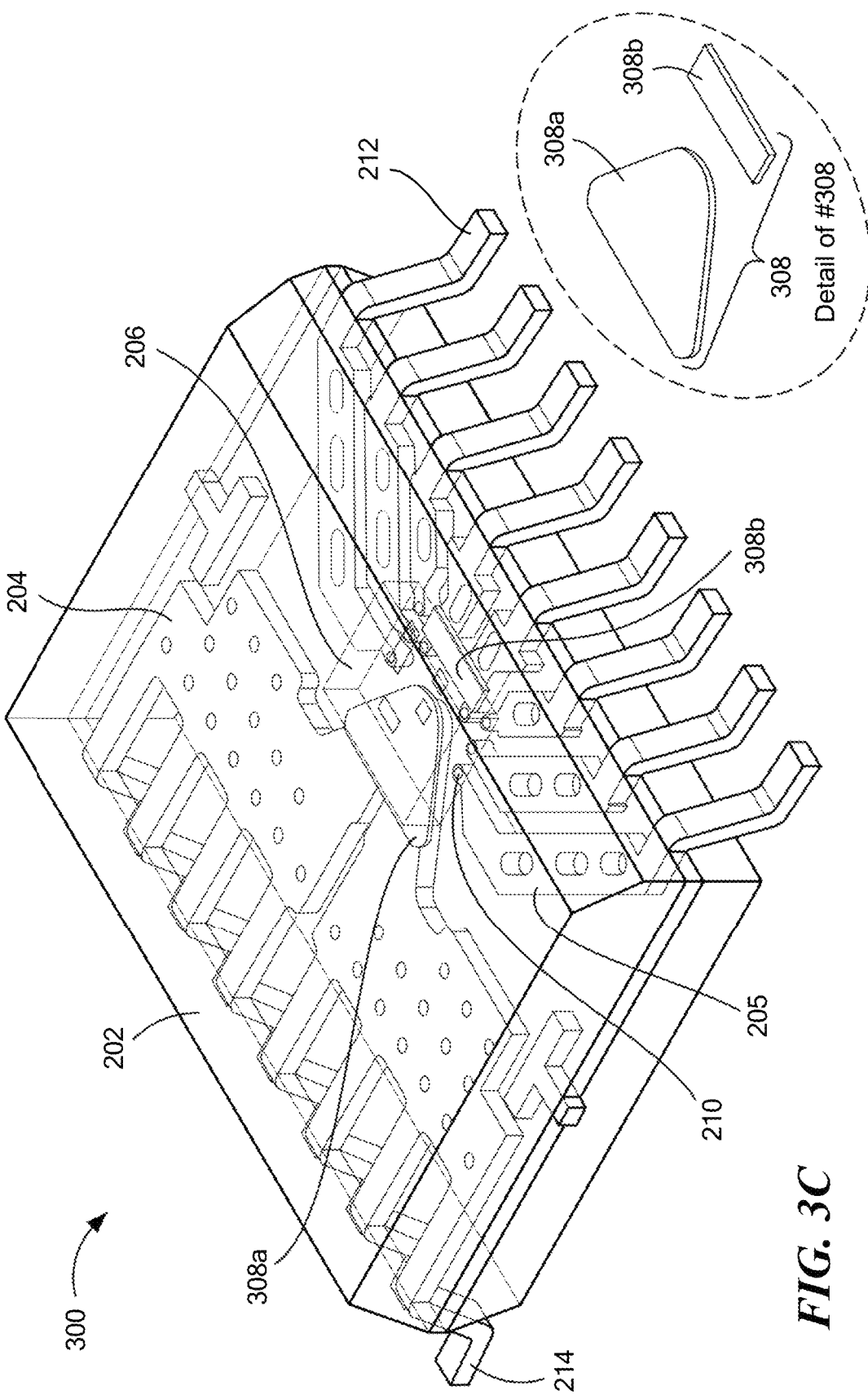
FIG. 3C is a top perspective view of the IC package of FIG. 3A according to aspects of the disclosure.

Referring now to FIGS. 3A-3C, a current sensor IC package 300 is shown. The IC package 300 is similar to the current sensor IC package 200 of FIGS. 2A-2C, however with an alternative insulation structure 308. Elements previously described with like reference numerals designate corresponding parts throughout the different views.

The current sensor IC package 300 may include an insulation structure 308 formed from a first portion 308a and a second portion 308b as separate bodies. According to one aspect, the insulation structure 308 may include a first portion 308a disposed between the semiconductor die 206 and the primary conductor 204. The insulation structure 308 may further include the second portion 308b as a separate body from the first portion 308a and disposed between the semiconductor die 206 and at least one of the signal leads 212. The two-body insulation structure 308 may evenly support the semiconductor die 206 across its length and/or width to provide a consistent gap height and reduce any die tilt.

Figure 4:
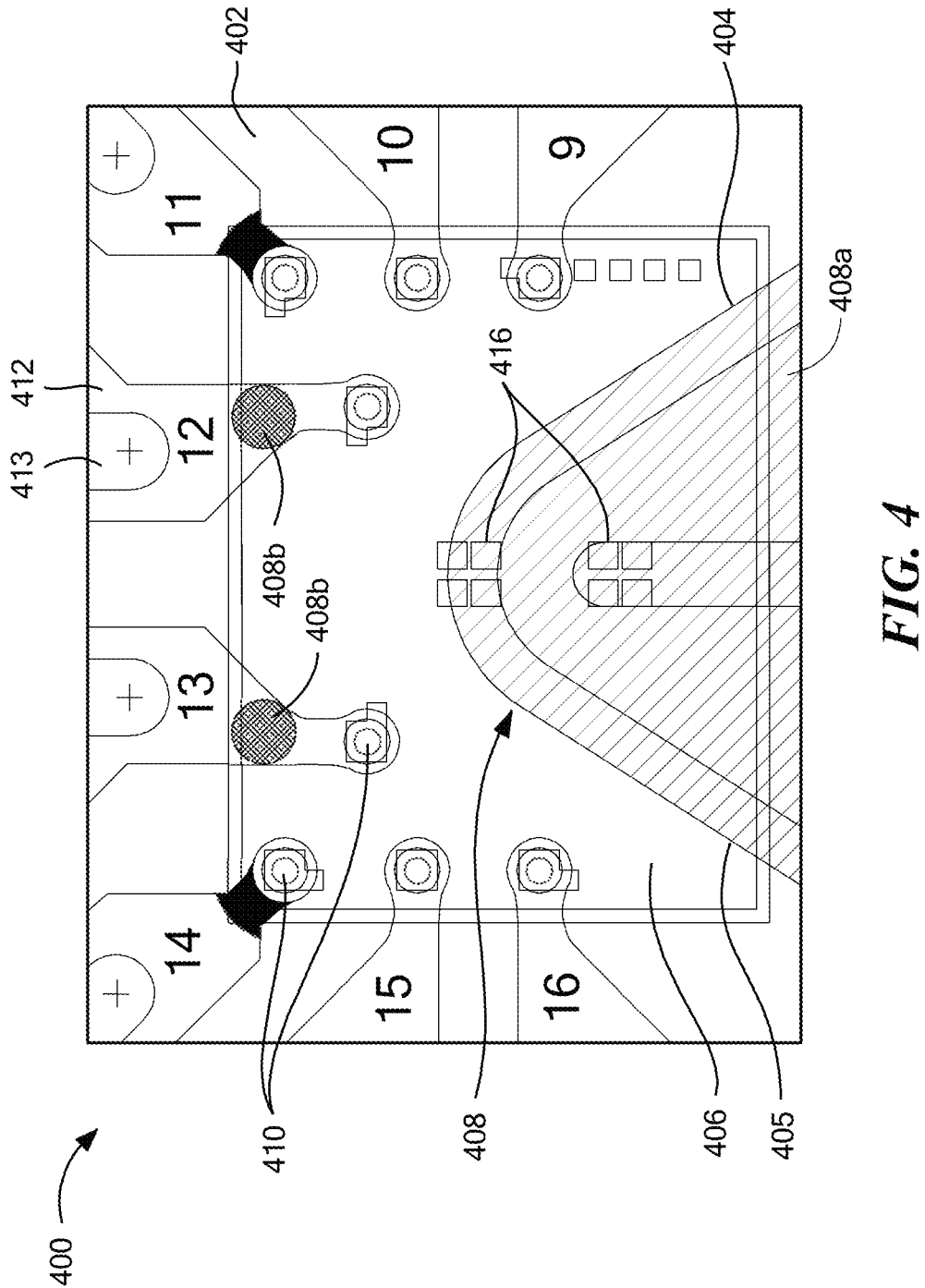
FIG. 4 is a partial top plan view of an IC package including an epoxy-based insulation structure according to aspects of the disclosure.

Referring now to FIG. 4, a current sensor IC package 400 may include an alternative insulation structure 408. According to one aspect, the current sensor IC package 400 is shown as a DFN package, however other package types are possible, including QFN or SOIC. To this end, the terminal ends of primary conductor 404 may be conductive pads (not shown) exposed from side and bottom surfaces of the package 400 and signal leads 412 may likewise be or include conductive pads 413 exposed from side and bottom surfaces of the package 400.

In other respects, the DFN package of FIG. 4 may be substantially similar as the SOIC package of FIGS. 3A-3C, including a molding material 402, a primary conductor 404, a semiconductor die 206 with one or more magnetic field sensing elements, bumps 410, and magnetic field sensing elements 416, the form and function of each being substantially similar to those previously described.

According to one aspect the insulation structure 408 may include or be formed by a first portion 408a and one or more epoxy dots 408b adapted to control gap height (i.e., the distance between the die 406 and the lead frame components) and reduce die tilt. According to one aspect, the insulation structure 408 may include a first portion 408a similar to those previously described in connection with FIGS. 3A-3C, such as a polyimide tape, or the like. A second portion of the insulation structure 408 may include one or more epoxy dots 408b disposed between one or more signal leads 412. The epoxy dots 408b may include non-conductive material such as 84-3 epoxy material made by Henkel Corporation, or the like. The epoxy dots 408b may be disposed on the signal leads 412 using a screen-printing process. The epoxy dots 408b may be sized and positioned to remain within the dimensions of the signal lead 412. According to one aspect, the epoxy dots 408b may be further dimensioned to a height or thickness substantially equal to the height or thickness of the first portion 408a of the insulation structure 408. The epoxy dots 408b, according to one aspect, may be further dimensioned to be within the dimensions of the semiconductor die 206. A mask may be used on the lead frame 405 exposing the target areas for the epoxy deposits to ensure the epoxy stays within the desired dimensions and geometry. Accordingly, the semiconductor die 206 may be disposed on the primary conductor 404 and the signal leads 412 with a controlled gap height and substantially no die tilt.

Figure 5A:
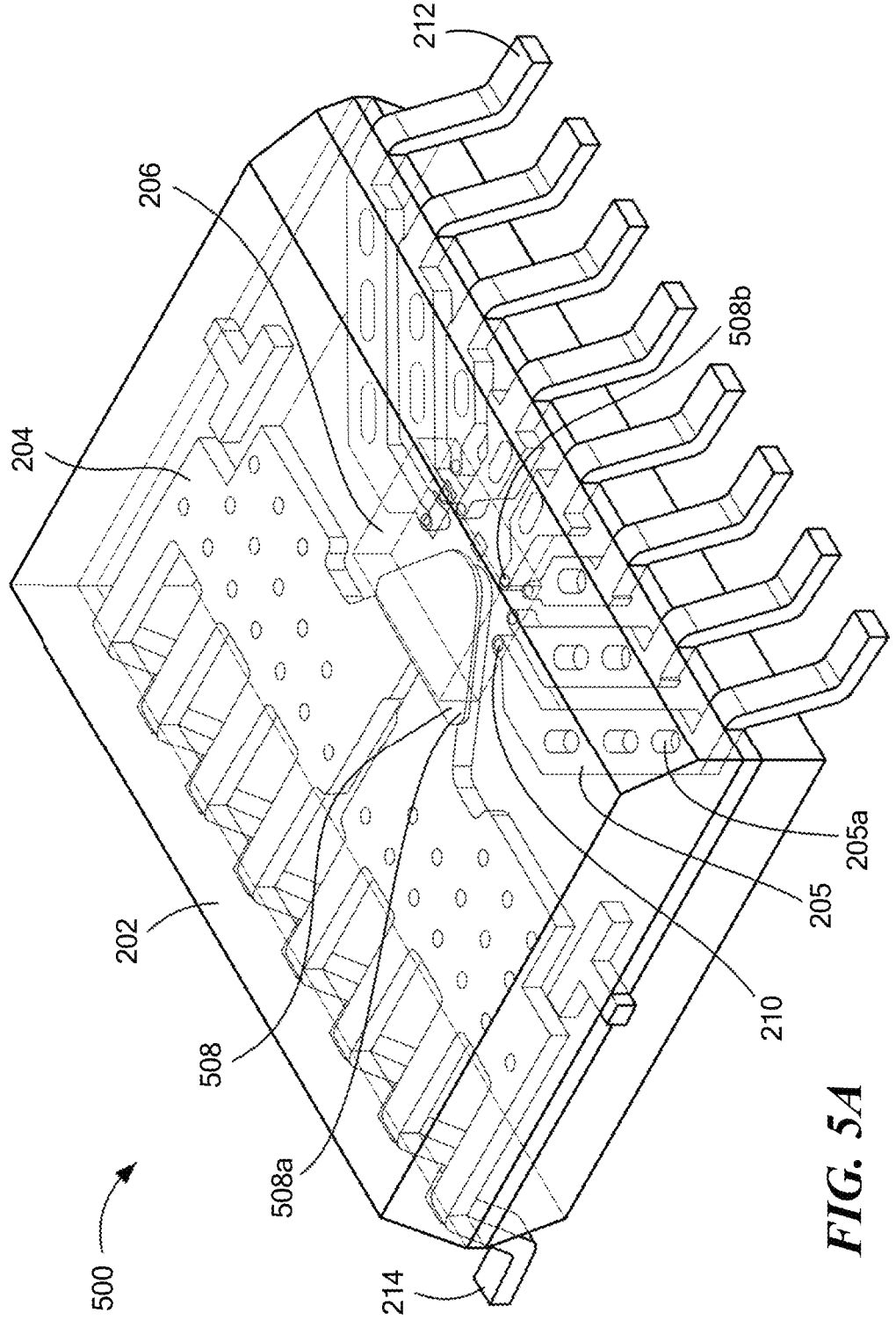
FIG. 5A is a top perspective view of an IC package including an epoxy-based insulation structure according to aspects of the disclosure.
Figure 5B:
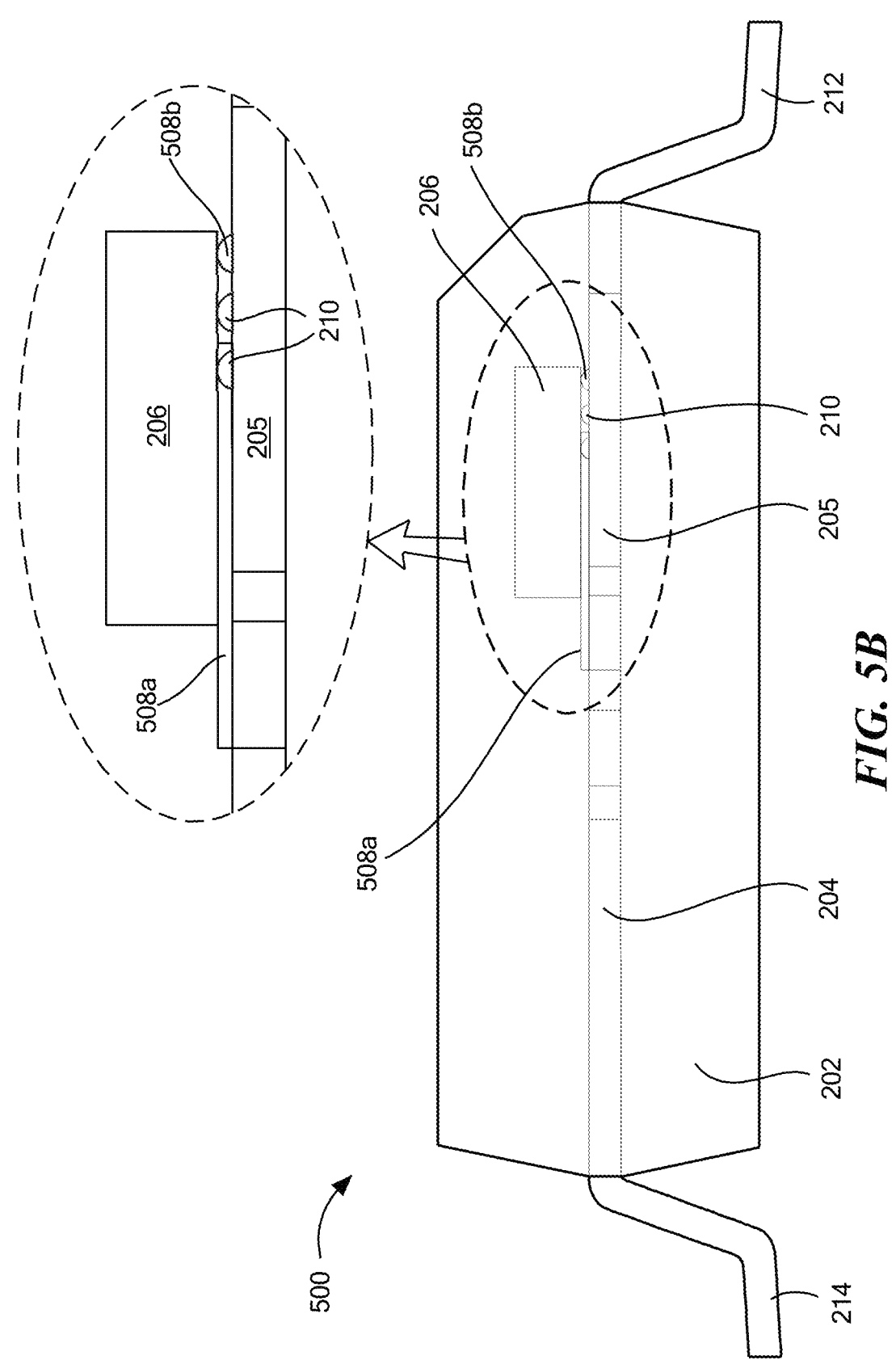
FIG. 5B is a side view of the IC package of FIG. 5A according to aspects of the disclosure.

Referring now to the various views shown in FIGS. 5A-5B, a current sensor IC package 500 may be a similar SOIC package like that shown in FIGS. 2A-2C, and include a molding material 202, a lead frame 205 with a primary conductor 204 and signal leads 212, primary conductor terminal ends 214, a semiconductor die 206, and bumps 210 similar to those previously described herein. The insulation structure 508, however, may be substantially similar to the insulation structure 408 of the IC package shown in FIG. 4. For example, the insulation structure 508 may include a first portion 508a including or formed from a polyimide tape disposed between a current path region of the primary conductor 204 and the semiconductor die 206.

The insulation structure 508 may further include a second portion including or formed from one or more non-conductive epoxy dots 508b between at least one of the signal leads 212 and the semiconductor die 206. The epoxy dots 508b may include non-conductive material such as 84-3 epoxy material made by Henkel Corporation, or the like. The epoxy dots 508b may be disposed on at least one of the signal leads 212 using a screen-printing process with a mask. The epoxy dots 508b may be sized and positioned to remain within the dimensions of the signal lead 212. According to one aspect, the epoxy dots 508b may be further dimensioned to a height or thickness substantially equal to the height or thickness of the first portion 508a of the insulation structure 508. Accordingly, the semiconductor die 206 may be disposed on the primary conductor 204 and the signal leads 212 with a controlled gap height and substantially no die tilt.

Figures 6A, 6B:
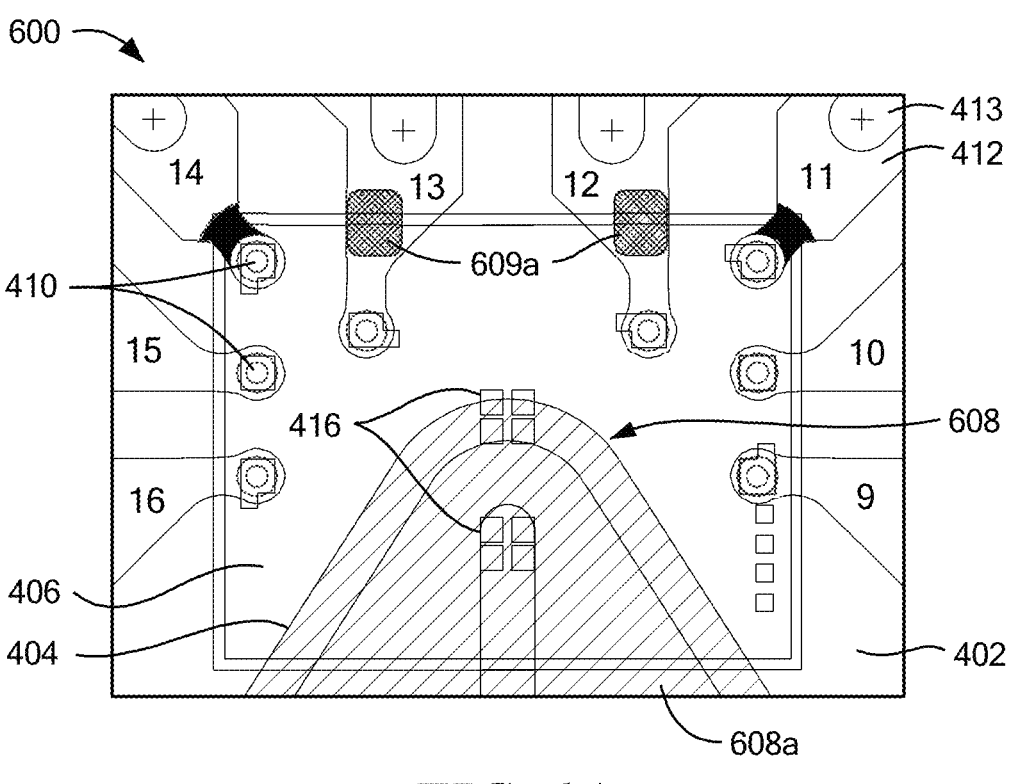
FIG. 6A is a partial top plan view of an IC package including shaped epoxy insulation structures according to aspects of the disclosure.
FIG. 6B is a partial top plan view of an IC package including alternative shaped epoxy insulation structures according to aspects of the disclosure.
Figure 6C:
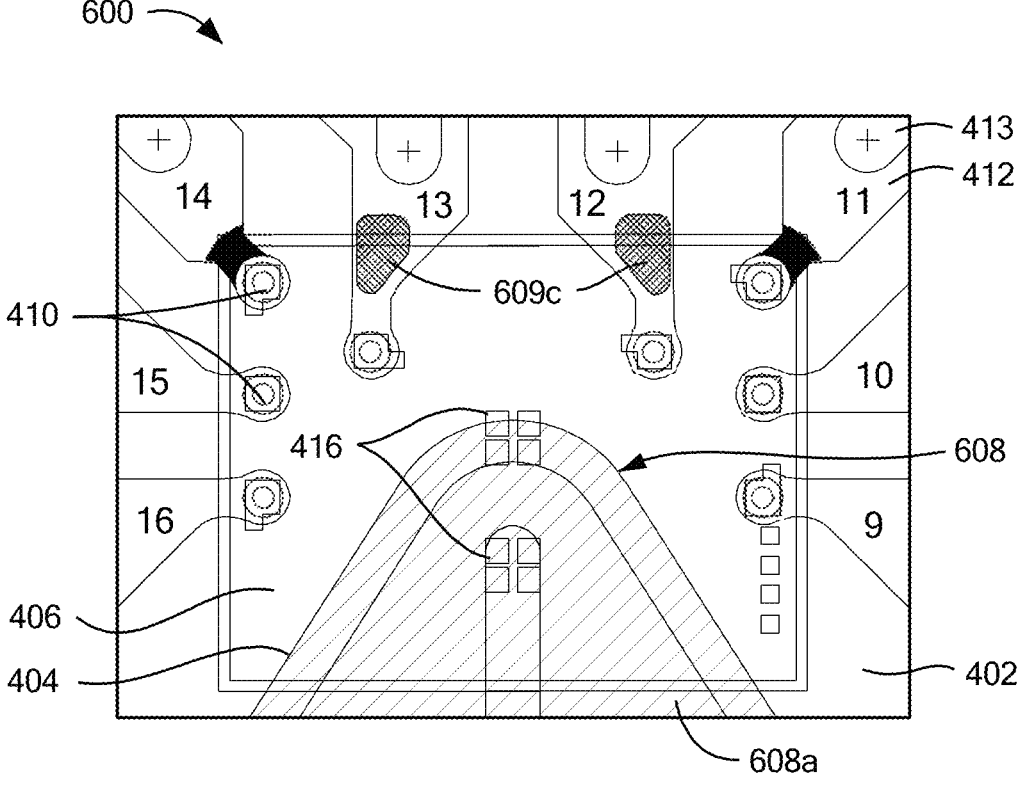
FIG. 6C is a partial top plan view of an IC package including other alternative shaped epoxy insulation structures according to aspects of the disclosure.

FIGS. 6A-6C show various configurations and shapes of an insulation structure 608 of a current sensor IC package 600 according to aspects of the disclosure. The current sensor IC package 600 may be a DFN package like that shown in FIG. 4, however other package types, including QFN or SOIC packages are possible. The current sensor IC package 600 may include, as previously described herein, a lead frame 405 with a primary conductor 404 and signal leads 412. The signal leads 412 may include conductive pads 413. The current sensor IC package 600 may also include a semiconductor die 406, bumps 410, magnetic field sensing elements 416, and molding material 402, as previously described.

According to one aspect, an insulation structure 608 may include a first portion 608*a* disposed between the primary conductor 404 and the semiconductor die 406. The first portion 608*a* may be substantially similar to the second portions 308*a*, 408*a*, 508*a*, previously described. According to one aspect, a second portion may include one or more epoxy dots 609*a* (FIG. 6A), 609*b* (FIG. 6B), 609*c* (FIG. 6C) disposed between at least one of the signal leads 412 and the semiconductor die 406.

FIG. 6A depicts a second portion of the insulation structure 608 including rectangularly shaped epoxy dots 609*a*. According to one aspect, the rectangular epoxy dots 609*a* may be sized and positioned to extend beyond the dimensions of the semiconductor die 406 but still remain within the dimensions of the signal leads 412. Such a configuration may provide added stability to the semiconductor die 406 while still providing substantial control over the gap height and die tilt. According to one aspect, the shapes of the epoxy dots 609*a* may be varied within lead fame space, as described herein, to increase bonding without compromising additional free space or other connections.

FIG. 6B depicts a second portion of the insulation structure 608 including oval shaped epoxy dots 609*b*. According to one aspect, the oval epoxy dots 609*a* may be sized and positioned to extend beyond the dimensions of the semiconductor die 406 but still remain within the dimensions of the signal leads 412. Such a configuration may provide added stability to the semiconductor die 406 while still providing substantial control over the gap height and die tilt.

FIG. 6C depicts a second portion of the insulation structure 608 including polygonal epoxy dots 609*c*. According to one aspect, the polygonal epoxy dots 609*c* may be sized and positioned to extend beyond the dimensions of the semiconductor die 406 and share a similar geometry profile as the signal lead 412 and still remain within the dimensions of the signal leads 412. Such a configuration may provide added stability to the semiconductor die 406 while still providing substantial control over the gap height and die tilt.

Figure 7A:
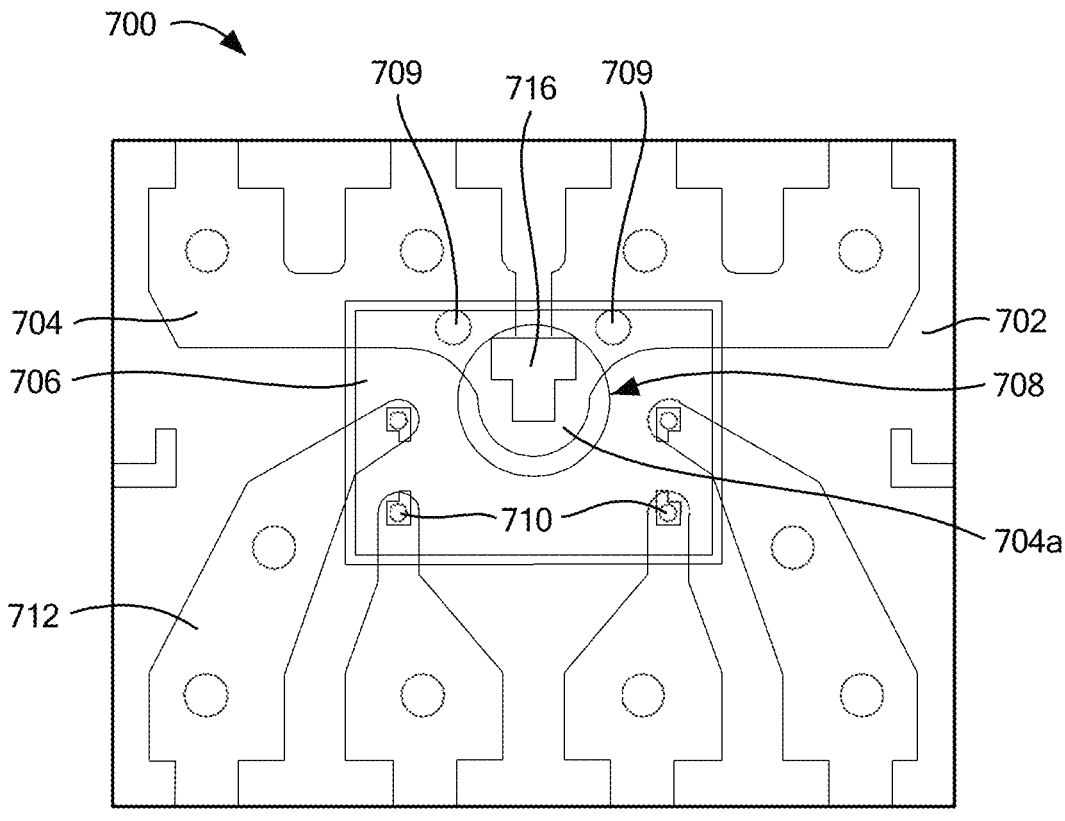
FIG. 7A is a partial top plan view of an IC package including an epoxy insulation structure on a primary conductor according to aspects of the disclosure.
Figure 7B:
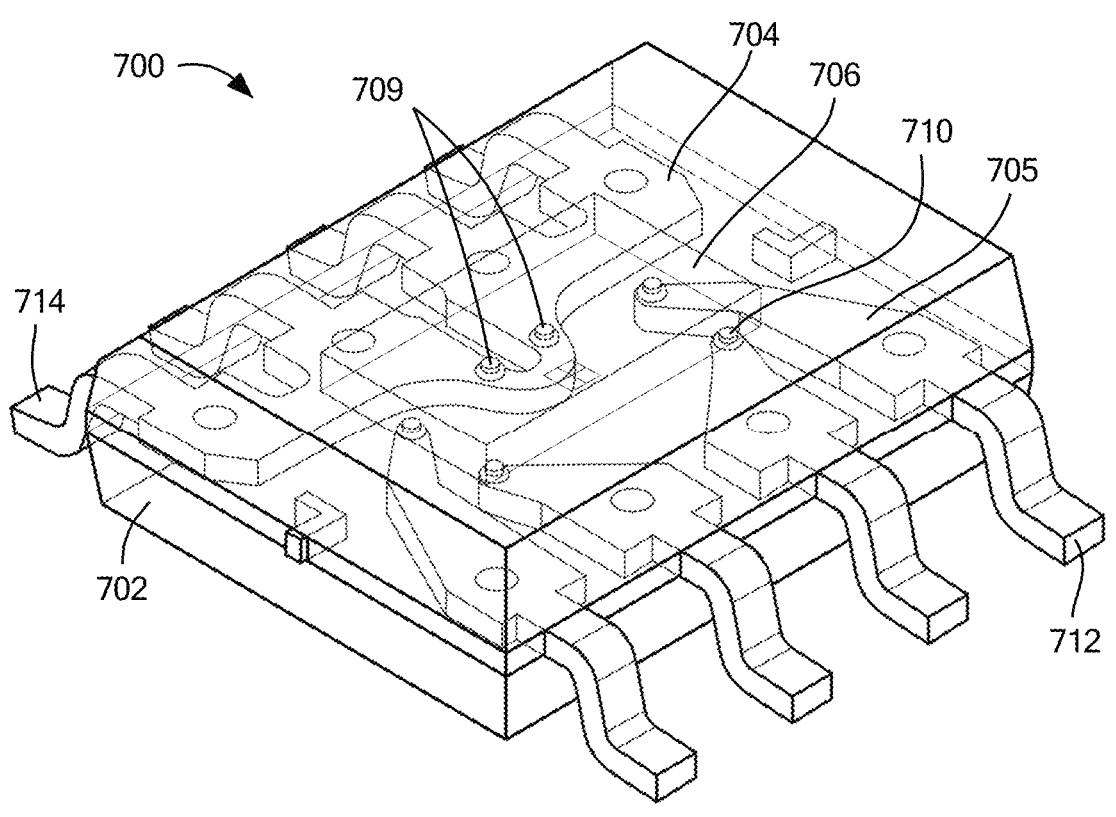
FIG. 7B is a top perspective view of the IC package of FIG. 7A according to aspects of the disclosure.
Figure 7C:
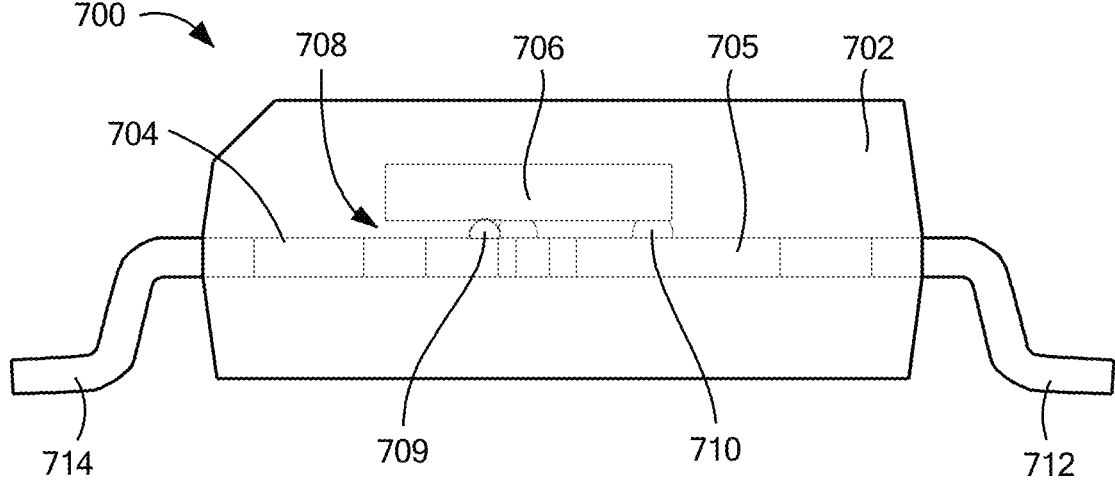
FIG. 7C is side view of the IC package of FIG. 7A according to aspects of the disclosure.

According to another aspect of the disclosure, die tilt and gap height between a semiconductor die and a lead frame may be controlled using one or more epoxy dots on a primary conductor. Referring to the various views in FIGS. 7A-7C, a current sensor IC package 700 with an alternative insulation structure 708 may be used to control gap height and reduce die tilt. The package 700 may be a SOIC, DEN, QFN, or other package type. The current sensor IC package 700 may include, as previously described herein, a primary conductor 704, a semiconductor die 706 with at least one magnetic field sensing element 716, signal leads 712, bumps 710, and molding material 702. An insulation structure 708 may include one or more non-conductive epoxy dots 709 disposed on a current path region 704*a* of the primary conductor 704.

The epoxy dots 709 may be dimensioned to control the gap height between the primary conductor 704 and the semiconductor die 706, thus substantially reducing any tilt of the die 706 that may be otherwise caused during manufacture by a gap height differential between the portion of the semiconductor die 706 coupled to at least one of the signal leads 712, for example by bumps 710, and the portion of the semiconductor die 706 coupled to the primary conductor 704.

The detailed description set forth above, in connection with the appended drawings, is intended as a description of various configurations and is not intended to represent the only configurations in which the concepts described herein may be practiced. The detailed description includes specific details for providing a thorough understanding of the various concepts. It will be apparent to those skilled in the art, however, that these concepts may be practiced without these specific details. In some instances, well-known structures and components are shown in block diagram form in order to avoid obscuring such concepts.

Based on the teachings, one skilled in the art should appreciate that the scope of the present disclosure is intended to cover any aspect of the present disclosure, whether implemented independently of or combined with any other aspect of the present disclosure. For example, an apparatus may be implemented or a method may be practiced using any number of the aspects set forth. In addition, the scope of the present disclosure is intended to cover such an apparatus or method practiced using other structure, functionality, or structure and functionality in addition to, or other than the various aspects of the present disclosure set forth. It should be understood that any aspect of the present disclosure may be embodied by one or more elements of a claim.

Although reference is made herein to particular materials, it is appreciated that other materials having similar functional and/or structural properties may be substituted where appropriate, and that a person having ordinary skill in the art would understand how to select such materials and incorporate them into embodiments of the concepts, techniques, and structures set forth herein without deviating from the scope of those teachings.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection."

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

As used herein, the term "determining" encompasses a wide variety of actions. For example, "determining" may include calculating, computing, processing, deriving, investigating, looking up (e.g., looking up in a table, a database or another data structure), ascertaining and the like. Additionally, "determining" may include receiving (e.g., receiving information), accessing (e.g., accessing data in a memory) and the like. Furthermore, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways. Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from scope of the claims.

What is claimed is:

1. A current sensor integrated circuit (IC) package comprising:
a lead frame comprising a primary conductor and signal leads, the lead frame having a lead frame surface;
a semiconductor die having a die surface adjacent to the lead frame surface, the semiconductor die comprising a magnetic field sensing element supported by the semiconductor die, wherein the magnetic field sensing element is configured to sense a magnetic field associated with a current through the primary conductor and generate an output signal indicative of the current; and
an insulation structure having first and second portions, wherein:
the first portion is located between a first location on the die surface and the primary conductor; and
the second portion is located between a second location on the die surface and a first one of the signal leads;
wherein the insulation structure is configured to prevent a tilt of the semiconductor die.

2. The current sensor IC package of claim 1 wherein the first and second portions of the insulation structure comprise a single body of material.

3. The current sensor IC package of claim 2 wherein the single body comprises a T-shape.

4. The current sensor IC package of claim 1 wherein the insulation structure comprises a polymer film.

5. The current sensor IC package of claim 4 wherein the insulation structure further comprises an adhesive layer.

6. The current sensor IC package of claim 5 wherein the polymer film and the adhesive layer are provided as a tape.

7. The current sensor IC package of claim 6 wherein the tape extends beyond a periphery of the semiconductor die.

8. The current sensor IC package of claim 7 wherein the tape extends beyond the primary conductor adjacent to the signal leads by at least 0.4 mm.

9. The current sensor IC package of claim 1 wherein the insulation structure comprises one or more epoxy dots.

10. The current sensor IC package of claim 1 wherein the first portion comprises a polymer film and the second portion comprises an epoxy dot.

11. The current sensor IC package of claim 10 wherein the epoxy dot is substantially rectangular.

12. The current sensor IC package of claim 10 wherein the epoxy dot is substantially oval.

13. The current sensor IC package of claim 10 wherein the epoxy dot is polygonal.

14. The current sensor IC package of claim 10 wherein the epoxy dot is screen printed onto the first one of the signal leads.

15. The current sensor IC package of claim 10 wherein the epoxy dot is dimensioned to be within dimensions of the first one of the signal leads.

16. The current sensor IC package of claim 1 wherein the insulation structure is adapted to support the semiconductor die across one or both of a width or a length of the semiconductor die.

17. A method of manufacturing a current sensor integrated circuit (IC) package, the method comprising:

providing a lead frame comprising a primary conductor and signal leads, the lead frame having a lead frame surface;

positioning a semiconductor die having a die surface adjacent to the lead frame surface, wherein the semiconductor die supports a magnetic field sensing element, the magnetic field sensing element configured to sense a magnetic field associated with a current through the primary conductor and to generate an output signal indicative of the current;

positioning a first portion of an insulation structure between a first location on the die surface and the primary conductor; and positioning a second portion of the insulation structure between a second location on the die surface and a first one of the signal leads;

wherein the insulation structure is configured to prevent a tilt of the semiconductor die.

18. The method of claim 17 wherein the first and second portions of the insulation structure comprise a single body of material.

19. The method of claim 18 wherein the single body comprises a T-shape.

20. The method of claim 17 wherein the insulation structure comprises a polymer film.

21. The method of claim 20 wherein the insulation structure further comprises an adhesive layer.

22. The method of claim 21 wherein the polymer film and the adhesive layer are provided as a tape.

23. The method of claim 22 wherein the tape extends beyond a periphery of the semiconductor die.

24. The method of claim 23 wherein the tape extends beyond the primary conductor adjacent to the signal leads by at least 0.4 mm.

25. The method of claim 17 wherein the insulation structure comprises one or more epoxy dots.

26. The method of claim 17 wherein the first portion comprises a polymer film and the second portion comprises an epoxy dot.

27. The method of claim 26 wherein the epoxy dot is substantially rectangular.

28. The method of claim 26 wherein the epoxy dot is substantially oval.

29. The method of claim 26 wherein the epoxy dot is polygonal.

30. The method of claim 26 wherein positioning the epoxy dot comprises screen printing the epoxy dot onto the first one of the signal leads.

31. The method of claim 26 further comprising dimensioning the epoxy dot to be within dimensions of the first one of the signal leads.

32. The method of claim 17 wherein the insulation structure is adapted to support the semiconductor die across one or both of a width or a length of the semiconductor die.

33. A current sensor integrated circuit (IC) package comprising:

a lead frame comprising a primary conductor and signal leads, the lead frame having a lead frame surface;

a semiconductor die having a die surface adjacent to the lead frame surface, the semiconductor die comprising a magnetic field sensing element supported by the semiconductor die, wherein the magnetic field sensing element is configured to sense a magnetic field associated with a current through the primary conductor and generate an output signal indicative of the current; and an insulation structure having first and second portions, wherein:

the first portion is located between a first location on the die surface and the primary conductor; and the second portion is located between a second location on the die surface and a first one of the signal leads;

wherein the insulation structure is configured to form a first gap height between the first location on the die surface and the primary conductor and a second gap height between the second location on the die surface and the first one of the signal leads.

34. The current sensor IC package of claim 33 wherein the first gap height and the second gap height are substantially equal.

\* \* \* \* \*